United States Patent
Nash et al.

(10) Patent No.: US 6,397,044 B1
(45) Date of Patent: May 28, 2002

(54) TRANSCEIVER

(75) Inventors: Adrian Nash, Camberley; Sean Brett, Chaeylesmore Park, both of (GB)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/466,866

(22) Filed: Dec. 17, 1999

(30) Foreign Application Priority Data

Dec. 18, 1998 (GB) .............................................. 9828025

(51) Int. Cl.$^7$ ................................................ H04B 1/04
(52) U.S. Cl. .................... 455/73; 455/323; 455/326; 455/319; 455/112; 455/118
(58) Field of Search .............................. 455/73, 84, 86, 455/112, 118, 317, 318, 319, 320, 323, 326, 330; 327/413, 116, 355, 356

(56) References Cited

U.S. PATENT DOCUMENTS

| | | |
|---|---|---|
| 3,983,489 A | 9/1976 | Gittinger .................... 325/449 |
| 5,113,094 A | 5/1992 | Grace et al. ................. 307/529 |
| 5,787,126 A | 7/1998 | Itoh et al. .................... 375/340 |
| 5,790,945 A * | 8/1998 | Erickson |
| 6,275,689 B1 * | 8/2001 | Gill ............................. 455/319 |

FOREIGN PATENT DOCUMENTS

| | | |
|---|---|---|
| EP | 0739 090 | 10/1996 |
| GB | 2 320 629 | 6/1998 |
| GB | 2332796 | 6/1999 |
| WO | WO 96/23366 | 8/1996 |
| WO | WO 97/30523 | 8/1997 |
| WO | WO 98/25353 | 6/1998 |

* cited by examiner

Primary Examiner—Thanh Cong Le
(74) Attorney, Agent, or Firm—Perman & Green, LLP (57) ABSTRACT

A transceiver for a portable radio communication apparatus comprising a receiver for receiving a signal at a received frequency and including a local oscillator, a transmitter being operable to transmit at a transmission frequency, said transmission frequency being offset from, and aligned to, the received frequency by a predetermined frequency spacing, the transmitter including a mixer having a first port for inputting said transmission frequency signal and a second port for inputting the local oscillator signal, and comprising means for rectifying the input local oscillator signal to provide a conductance waveform at a multiple of the local oscillator signal and means for mixing said transmission frequency signal with the conductance waveform at said multiple of the local oscillator signal frequency for down-converting the transmission frequency signal to an intermediate frequency signal.

12 Claims, 5 Drawing Sheets

TRANSCEIVER

BACKGROUND OF THE INVENTION

The present invention relates to a transceiver for a portable radio communication apparatus and in particular to a transceiver using direct conversion in the receiver.

A general trend in portable communication apparatus is the reduction in volume weight and power consumption of such apparatus. This had lead to efforts towards reducing the number of elements and devices necessary to perform the functions associated with portable communication apparatus. One approach has been to reduce the number of stages in the radio frequency front end by converting a received radio frequency carrier signal down to a DC intermediate frequency (zero IF) in a single step. This is known as direct conversion.

To carry out direct conversion, a local oscillator signal (LO) having the same frequency as the radio frequency carrier signal (ie. the LO is "on-channel") is mixed with the carrier signal in a suitable non-linear device such as a mixer diode. The output of the mixer contains the sum and difference of the LO and the carrier signal. Thus a mixer product exists at twice the carrier signal, and also at DC (zero Hz). The high frequency mixer products can be filtered by a suitable low pass filter. Once the radio frequency carrier signal has been down-converted, the modulating signal may be de-modulated using an appropriate demodulator, e.g. an I/Q demodulator for an I/Q modulating signal.

In the field of radio telephony, particularly cellular telephony, use of a direct conversion receiver is not without certain drawbacks.

Radio telephones operating in the same cell of a cellular telephone network typically receive control signals on the same signal frequency as each other. This is necessary since such control signals are often so-called "broadcast" control signals such as paging signals which need to be received by all the telephones operating in the same cell. Signals received by radio telephones can be of very low power, e.g. below −100 dBm and the sensitivity of the receivers is adapted accordingly.

Against the requirement for radio telephones in the same cell to be tuned to common frequencies, the introduction of direct conversion receivers with their strong on-board LO signals presents the problem of interference. More specifically, spurious LO leakage from the receiver into the antenna can cause in-band interference with other nearby receivers tuned to the same channel. Therefore, such a receiver would require a very high level of isolation between the local oscillator and the antenna in order to avoid swamping or saturating receivers of any nearby radio telephones. Such high levels of isolation are very difficult to achieve due to stray capacitances directly coupling local oscillator energy into the antenna. This is the case even when conventional mixers such as a Gilbert cell is used.

Previous methods addressing the problem of LO leakage included:
  providing increased reverse-isolation in the RF path to the antenna, for example introducing multi-stage RF amplifiers,
  inserting an isolator,
  reducing the local oscillator drive power to very low levels.

However, these methods were seen to have certain shortcomings, in particular, they were found to be detrimental to dynamic range and degrading to sensitivity, as well as being expensive to implement.

The present inventors devised a solution to the problem LO interference by providing a receiver which uses subharmonic mixing whereby, the received signal can be down-converted without employing a local oscillator at the carrier frequency of the received signal. Accordingly, the local oscillator signal frequency is far removed from received signal frequency, resulting in the mixer providing very high local oscillator to received signal isolation. This is because leakage of local oscillator radiation from the receiver to the antenna has negligible effect on other receivers in close proximity receiving on the same channel as the received signal. Thus, less shielding is necessary to inhibit interference signals generated by the local oscillator leaking out and interfering with adjacent apparatus than for a local oscillator near or at the radio frequency signal. This invention is disclosed in GB patent publication number 2 332 796 A.

Whilst running the local oscillator at a fraction of the received signal frequency is advantageous in terms of the receiver it imposes new criteria on the transmitter design.

In cellular radiotelephone transceiver design it is standard to couple the local oscillator used in the receiver to the transmitter. In other words, the transmitter runs off the same local oscillator as that used by the receiver, i.e. it is 'slaved' to the receiver LO. This ensures that the correct duplex spacing is maintained between the transmitter and the receiver, that is to say the transmitter operates at a frequency level which is a fixed, predetermined and constant frequency spacing from the receiver channel. In GSM the duplex spacing is 45 MHz in 900 MHz band, and 75 MHz in 1.8 GHz band.

In conventional direct conversion transceivers the requirement for the transmitter to run from the same local oscillator as the receiver is met because the local oscillator is on-channel, i.e. it runs at the carrier frequency. However, in a direct conversion receiver using a local oscillator at a subharmonic of the reference frequency, it is no longer possible directly to use the local oscillator in the transmitter design.

Therefore, the present inventors set about to solve the problem of providing a transceiver in which a direct conversion receiver operating from a subharmonic local oscillator could be 'slaved' to the transmitter. One proposal was to mix the local oscillator with a further introduced (ultra high frequency) synthesiser. This approach was however found to be unsatisfactory because of complexity, and because the introduction of the strong local oscillator was detrimental to performance.

SUMMARY OF THE INVENTION

Accordingly, one aspect of the present invention provides a transceiver for a portable radio communication apparatus comprising a receiver for receiving a signal at a received frequency and including a local oscillator, a transmitter being operable to transmit at a transmission frequency, said transmission frequency being offset from, and aligned to, the received frequency by a predetermined frequency spacing, the transmitter including a mixer having a first port for inputting said transmission frequency signal and a second port for inputting the local oscillator signal, and comprising means for rectifying the input local oscillator signal to provide a conductance waveform at a multiple of the local oscillator signal and means for mixing said transmission frequency signal with the conductance waveform at said multiple of the local oscillator signal frequency for down-converting the transmission frequency signal to a transmitter intermediate frequency signal.

By means of the invention, the mixer allows mixing of the receiver local oscillator with the transmission frequency without the need to introduce a further VHF oscillator, thereby substantially reducing the risk of high frequency local oscillator leakage, and the associated additional cost, power consumption and complexity (of the extra synthesiser).

In a first embodiment of the present invention, the rectifying means and the coupling means comprise a balanced anti-phase output transformer and switching means, wherein a signal output from the transformer drives the switching means at a multiple of the local oscillator frequency.

The balanced anti-phase output transformer further improves isolation between the input (radio frequency) port and the local oscillator port. Optionally, the transformer may be a strip line, slot-line, co-planar microstrip and/or microstrip balanced to unbalanced transformer. As an alternative to the transformer, a ceramic type balanced phase splitter could also be used.

Preferably, the switching means comprises an anti-parallel diode pair, and respective diodes are electrically coupled to respective arms of the balanced output of the transformer, and suitably the diodes are Schottky diodes.

Advantageously, the switching means comprises a further anti-parallel diode pair, and respective diodes of the further anti-parallel pair are reversibly electrically coupled to respective arms of the balanced output of the transformer relative to the said anti-parallel diode pair. Such a dual anti-parallel diode pair configuration provides a higher balance between arms of the switching means than achievable with a single anti-parallel diode pair. This further improves isolation between the radio frequency and local oscillator ports and reduction in local oscillator second harmonic.

In a second embodiment of the present invention, the rectifying means and the coupling means comprise a phase splitter and a plurality of transistors arranged in a network, wherein a signal output from the driver transistor drives the transistor network at a multiple of the local oscillator frequency.

The use of transistors in the second embodiment advantageously provides for the integration of the embodiment into an integrated circuit.

Preferably, the phase splitter provides anti-phase local oscillator drive signals to the plurality of transistors arranged in a network, and the driver transistor may comprise a unipolar transistor, conveniently an FET transistor, while the plurality of transistors arranged in a network may comprise bipolar transistors in a bridge configuration, or FET's.

For this application of direct conversion receiver the local oscillator is half the received frequency.

An advantageous feature of the mixers disclosed herein is that they are bi-directional.

BRIEF DESCRIPTION OF THE DRAWINGS

Specific embodiments in accordance with the invention are hereinafter described, by way of example only, and with reference to the accompanying drawings, in which.

DETAILED DESCRIPTION OF THE DRAWINGS

Figure 1:
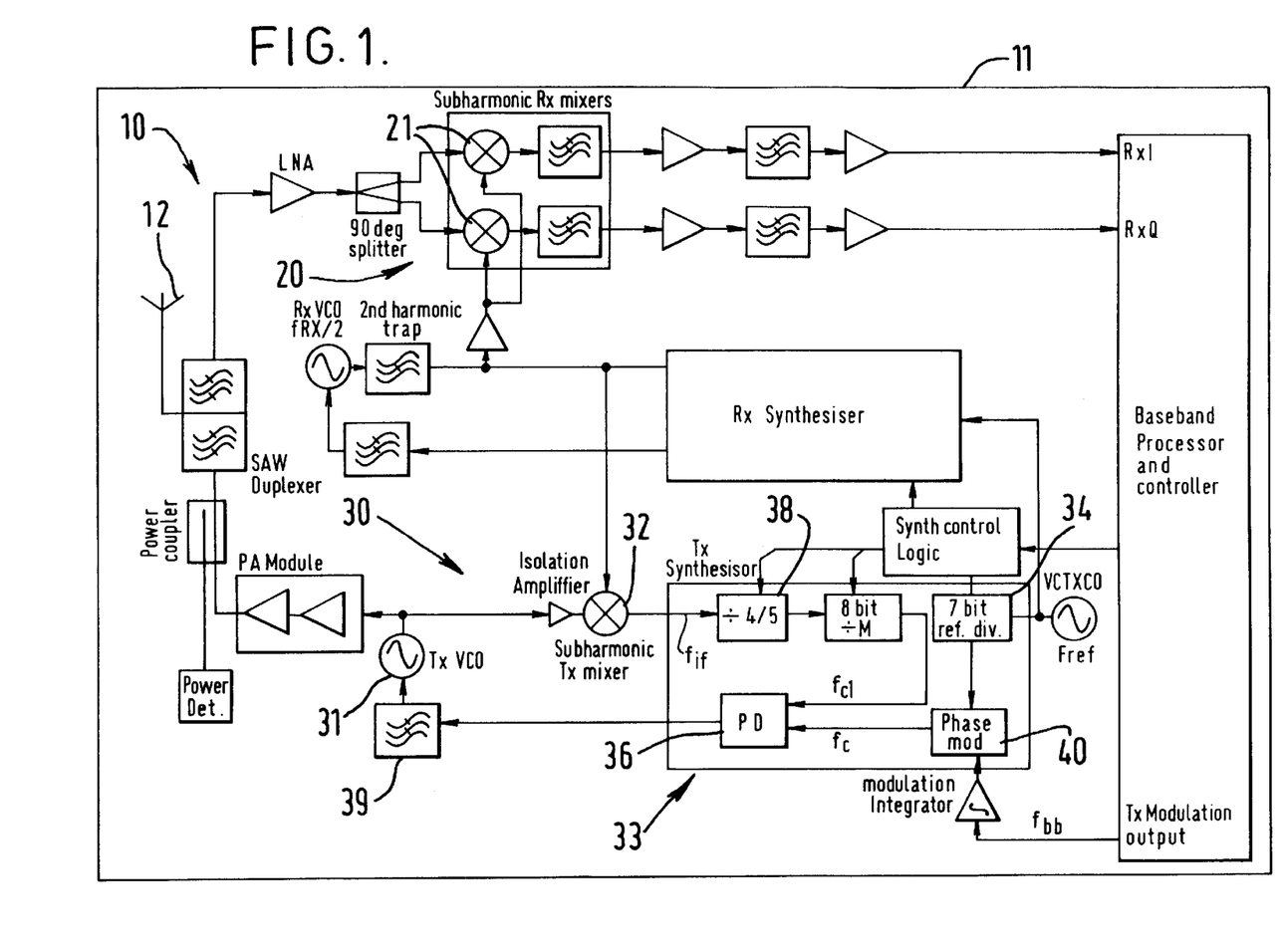
FIG. 1 schematically represents an embodiment of part of a transceiver in accordance with the present invention.

FIG. 1 shows the system architecture of a transceiver (10) in accordance with a preferred embodiment of the present invention for use in an analogue cellular phone (11). The transceiver comprises a receiver indicated generally as (20), and a transmitter indicated generally as (30).

The radio telephone (11) includes all the usual functional elements associated with radio telephones, such as a key pad, display, microphone, ear-piece, transceiver unit and baseband system logic and IF filter, and a micro-controller to control all the functional elements. It also includes an antenna (12), capable of receiving and transmitting radio frequency signals and is coupled to the transceiver (10).

A detailed disclosure of the receiver is provided in GB patent publication number 2 332 796 A. Briefly however, the receiver is a direct conversion type receiver comprising sub-harmonic mixers (21) which mix the received signal frequency with the receiver local oscillator (22) frequency to thereby perform down conversion of the received frequency to an intermediate frequency. The local oscillator for this type of mixer operates at half the channel frequency i.e. this sub-harmonic. Typically, the received frequency is UHF 880 MHz and the mixer frequency is 440 MHz. The sub-harmonic mixers are adapted to be operable within a 840 MHz to 1080 MHz frequency range.

The transmitter (30) uses a scheme which is known as modulation in the loop and this is disclosed in detail in GB patent application number 9626715.8. In the transmitter the Voltage Control Oscillator (VCO) (31) is on-channel, and the transmitter VCO tracks the receiver local oscillator (22) by a phase locked loop incorporating a down conversion mixer (32). Since the receiver local oscillator is operating at 440 MHz, the transmitter down-conversion mixer (32) is a subharmonic type, but unlike the receiver mixers it is preferred that the mixer is an active, integrated version which can be incorporated into the RF ASIC.

In more detail, the transmitter (30) comprises a phase locked loop (33), a reference frequency divider (34) and a power amplifier module (35). The phase locked loop up-converts the frequency of a baseband signal $f_{bb}$ to a frequency for transmission, i.e. the PLL frequency modulates the carrier at a rate of $f_{bb}$. The reference frequency divider (34) enables an appropriate reference frequency $F_{ref}/R$ to be obtained from a larger frequency $F_{ref}$. This reference frequency divider (34) can be dispensed with if a frequency source provides the appropriate reference frequency $F_{ref}/R$. The power amplifier module (35) amplifies the output of the phase lock loop (33) to a suitable level for radio transmission.

The phase locked loop (33) comprises a phase detector (36) and the transmitter Voltage Control Oscillator (37) in a forward path, and a feedback and an isolation amplifier path from the VCO (37) to the phase detector (36). It includes the mixer (32) in the feedback path having inputs from the VCO and the receiver local oscillator (22). The output of the mixer is fed to a dual modulus/fixed frequency divider (38). The phase locked loop also comprises a low pass filter (39) and a phase modulator (40). The low pass filter (39) is positioned in the forward path between the phase detector (36) and the VCO (31) and it controls the bandwidth of the phase locked loop (33). It is chosen to pass the signals of baseband, and to filter out other frequencies, in particular the reference frequency $F_{ref}/R$. For example, the low pass filter for an audio baseband signal might pass frequency at 20 kHz or less but block those over 20 kHz.

The mixer (32) is provided to downconvert the frequency of the signal output from the phase locked loop (33). It mixes signals at its two inputs to generate a signal having a different frequency. One of the inputs is connected to the output of phase locked loop (33) and the other is connected to the receiver local oscillator (22). A detailed account of the mixer is given below.

The frequency divider (38) is used to change the offset between the transmit and receive channels. The modulator (40) modulates the baseband signal $f_{bb}$ onto the divided reference signal $F_{ref}/R$. It is a coupled to the input of the phase locked loop, that is, to one of the inputs of the phase comparator (36) so that the resultant modulated signal $f_c$ can be compared with the signal $f_{c1}$ feedback to the other input of the phase comparator (36). The modulation process introduces a delay or advance of the edge of the divided reference signal $F_{ref}/R$ by an amount relative to amplitude of the modulating wave form (baseband signal). The delay is related to the phase shift by $\tau = \omega.\phi$ where $\tau$ is the introduced delay (or advance), $\omega$ is the angular frequency of the resultant modulated signal $f_c$ and $\phi$ is the phase shift. The maximum phase shift required is represented by the modulation index $\beta$, and is determined by the peak frequency deviation of the system $\Delta\omega$ divided by the modulating frequency $\omega_{mod}$ ($\beta = \Delta\omega/\omega_{mod}$). Modulation generated at the carrier frequency, $fc = F_{ref}/R$ occurs at the transmit frequency $f_{tx}$ also. Since the loop acts as a frequency multiplier, the transmit frequency $f_{tx} = f_{lo} - N.f_c$ (where $f_{lo} > f_{tx}$) or $f_{tx} = f_{lo} + N.fc$ (where $f_{lo} < f_{tx}$). The operation of the loop causes multiplication of the modulated signal by N. So if the modulation index $\beta$ is required at the transmit frequency $f_{tx}$, then $\beta/N$ is required at $fc$ to produce this effect. Consequently the modulation process can be thought of as a variable delay, which is varying at the rate of the modulating frequency $f_{bb}$, with a peak amplitude dependent upon the modulating wave form amplitude. That is, phase modulation.

The base band signal $f_{bb}$ is modulated on through the divided reference frequency $F_{ref}/R$ by the modulator (40) and the resultant modulated signal $fc$ is applied to one on the inputs of the phase detector (36). The fed back signal $f_{c1}$ from the output of the phase locked loop (33) is applied to other input of the phase detector. The phase detector (36) multiples these two signals and the result of the signal is output to the low pass filter (39). The filter generates the modulating signal $f_{bb}$. It passes the signals with the baseband frequencies and blocks those outside the baseband frequency range. The generated modulating signal is applied to the VCO (31). The VCO outputs a signal $f_{tx}$ having a peak frequency shift $\Delta f_{tx}$ proportional to the amplitude of the applied modulating signal, leading to a peak frequency deviation of $f_{tx} \pm \Delta f_{tx}$. The VCO output signal $f_{tx}$ has a frequency high enough for radio transmission. This signal is output from the phase locked loop (33) to the power amplifier module (35) for amplification and then onto the antenna (12) for radio transmission. It is also applied to the feedback path of the phase locked loop (33) where its frequency is down converted.

The mixer (32) mixes the VCO output signal with that provided by the local oscillator (22) of the receiver and outputs a down converted signal $f_{if}$. This down converted signal $f_{if}$ is then divided by the main frequency divider (38) to further down convert the signal $f_{if}$ and thus generate a signal of frequency $f_{c1}$ which, when the loop is locked, equals $f_c$. Alternatively, rather than frequency dividing the signal $f_{if}$ output from the mixer, the main frequency divider could frequency divided the signal $f_{lo}$ from the frequency source i.e. the local oscillator and then input the resultant frequency dividers signal to the mixer input (32).

The phase detector (36) compares the signals $f_{c1}$ and $f_c$ and the phase locked loop adjusts the output if necessary until the loop is locked.

There may also be provided an integrator between the baseband frequency and the phase modulator (40). The addition of the integrator makes the delay proportional to the amplitude and inversely proportional to the frequency of the modulating waveform.

Since the direct conversion receiver has no image response, the specification of the duplexer can be relaxed and no inter-stage SAW filter (between the LNA and mixers) is required for image rejection purposes.

The IF amplification and filtering is carried out by IC amplifiers and digital filters. This is possible because the bandwidth of the I/Q channels is about 15 kHz instead of an IF frequency (eg 45 MHz). Low power digital CMOS technology is used to perform the FM detection, RSSI, AGC, AFC and channel selection filtering functions; functions which are traditionally performed at the $2^{nd}$ IF by an analogue IC in a superheterodyne receiver. The DSP functions take less power than the equivalent analogue circuits and can be integrated into the baseband ASIC thus reducing cost, power consumption and PCB area.

Figure 2:
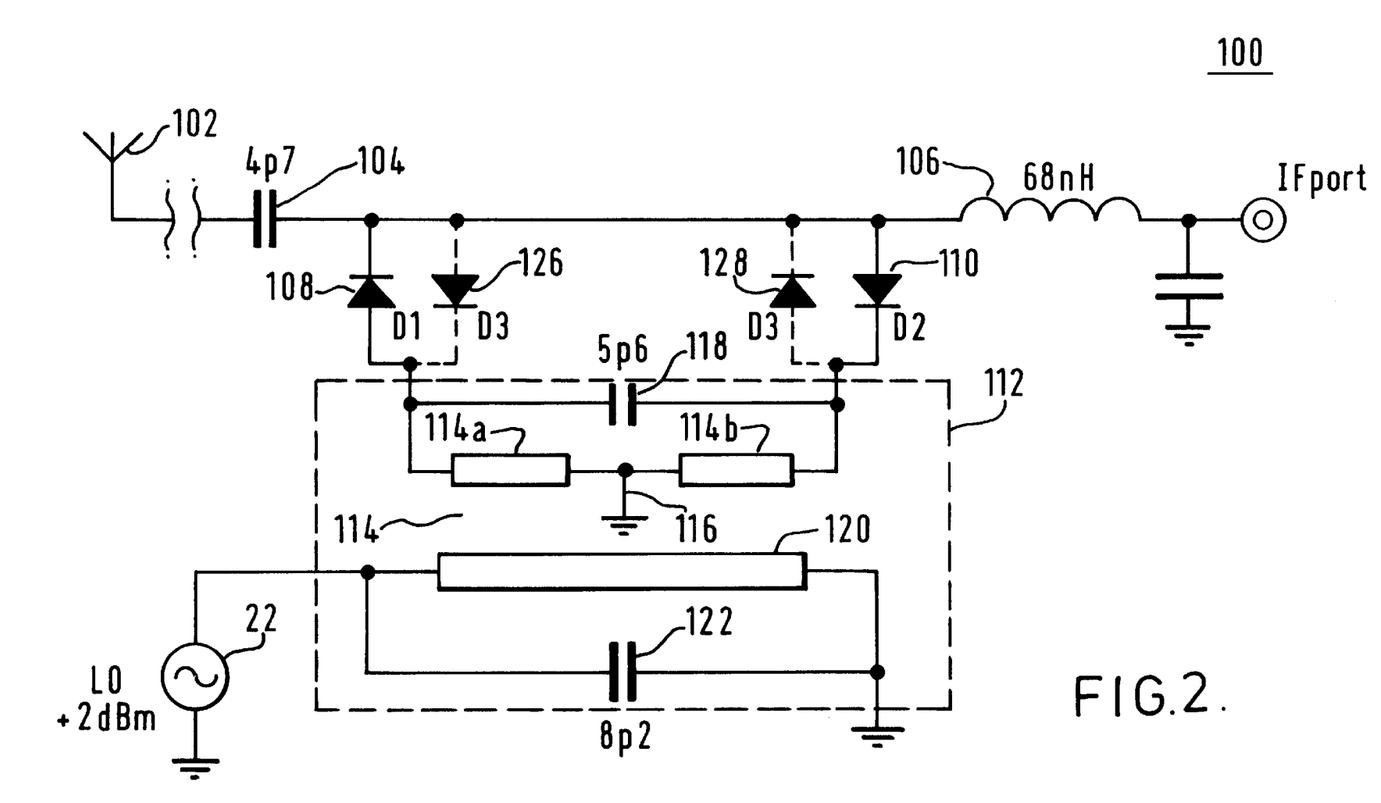
FIG. 2 schematically represents a first embodiment of a sub-harmonic mixer of the transceiver of the present invention.

The configuration of the mixer (32) will now be described in greater detail with reference to the embodiments in FIGS. 2 and 3. Referring initially to FIG. 2, a capacitor 104 decouples the mixer from the input for the radio transmission signal $f_{tx}$. Decoupling capacitor 104 is series coupled to an inductor 106, which acts as a low-pass output filter. An anti-parallel diode pair comprising Schottky diodes D1 and D2, references 108 and 110 respectively, is parallel coupled between capacitor 104 and inductor 106. The anti-parallel pair D1, D2 is also coupled to the balanced output of balanced-to-unbalanced (Balun) transition 112. FIG. 2 indicates typical values for the circuit components.

Balun 112 comprises a balanced stripline output 114 having respective sub-sections 114a and 114b centred about an earth reference potential 116. A tuning capacitor 118 is coupled across balanced output 114. Transformer Balun 112 further comprises unbalanced stripline input 120, having a tuning capacitor 122 coupled across it. A local oscillator signal LO is coupled to the unbalanced input from local oscillator generator 124. A typical LO output power level is 2 dBm. The balanced output 114 produces anti-phased signals in respective arms 114a and 114b.

The receiver local oscillator generator 22 supplies an LO signal to the unbalanced input 120 of Balun 112. The LO signal is coupled to balanced output 114. A voltage $V_{1LO}(t)$ is applied across the terminals of D1 (108), and a voltage $V_{2LO}(t)$ is applied across the terminals of D2 (110). Voltage $V_{1LO}(t)$ is shown schematically in FIG. 3 and is labelled reference 202, and $V_{2LO}(t)$ is reference 210 (dotted). The conductance waveforms $g_1(t)$, $g_2(t)$ for D1 (108) and D2 (110) are shown labelled 204/206 respectively in FIG. 3.

Figure 3:
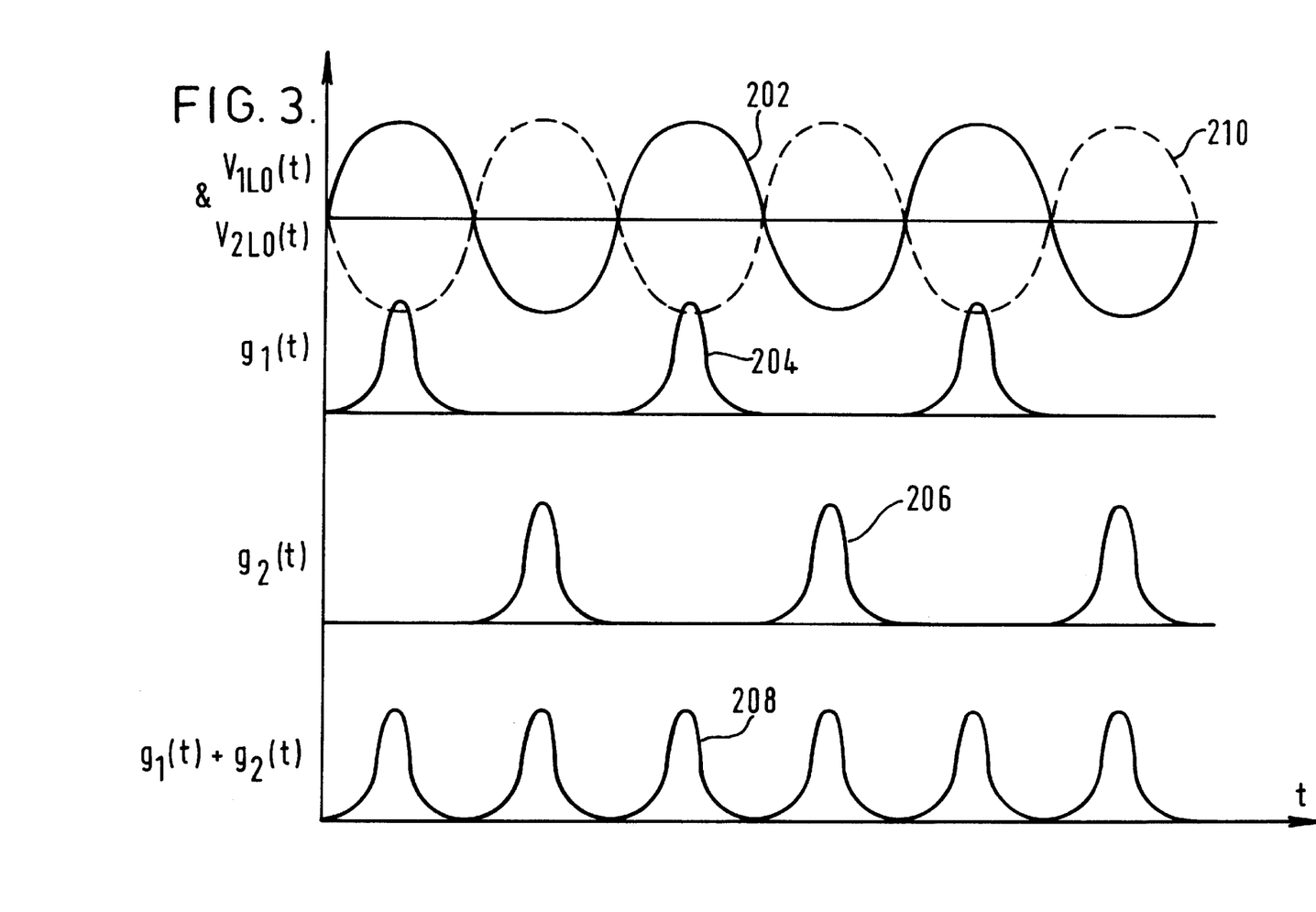
FIG. 3 shows the correspondence of the local oscillator diodes D1 and D2, and the respective and combined conductance waveforms for D1 and D2 for the embodiment described with reference to FIG. 2

The combined conductance waveform $g_1(t)+g_2(t)$ is shown labelled 208 in FIG. 3. As can be seen from FIG. 3, the combined conductance waveform 208 has a frequency which is twice that of the local oscillator signals 202 and 210 respectively produced at arms 114a and 114b.

Referring back to FIG. 2, the conductance waveform 208 of anti-parallel diode pair D1/D2 (108, 110) causes switching of the radio frequency carrier signal input across capacitor 104 at a rate twice that of the LO signal. This is achieved by coupling the radio frequency carrier signal to ground in accordance with waveform 208. Switching the radio frequency signal in this manner downconverts it to a frequency given by the difference in frequency between the transmission frequency signal $f_{tx}$, and twice the local oscillator frequency $2f_{LO}$. It is apparent to a person of ordinary skill in the art that the fundamental response also includes a signal at the sum ($f_{tx}+2f_{LO}$) of the frequencies. The sum and other higher order products are not relevant to the described embodiment, and are attenuated by low-pass filter 106, and capacitor.

For the embodiment of FIG. 2, the LO frequency would be in the range 420 MHz to 540 MHz. Since the LO pump fundamental is half $f_{RF}$, there is very little 2×LO signal generated directly from the mixing process (at $f_{RF}$) (i.e. 2nd harmonic frequency of the LO frequency). Due to the second harmonic's naturally low power level and the selective filtering inherent in the VCO, the second harmonic is at a much lower power level than the fundamental frequency. Additionally, since the fundamental frequency is not multiplied and the harmonic (i.e. twice LO frequency) component is filtered, the phase noise remains substantially constant. Furthermore, a high phase balance between respective anti-phased arms 114a and 114b reduces generation of signals at the second harmonic of the LO.

Balun 112 need not be stripline, but may be another Balun transition. However, it is important that the respective signals produced at 114a and 114b are very well phase-balanced. Discrete Balluns lend themselves to high levels of phase balance, and are the preferred embodiment. In general, the circuit components for the sub-harmonic pumped mixer shown in FIG. 2 are chosen and configured to give a high level of phase and amplitude balance across the arms of the anti-diode parallel pair.

Figure 4:
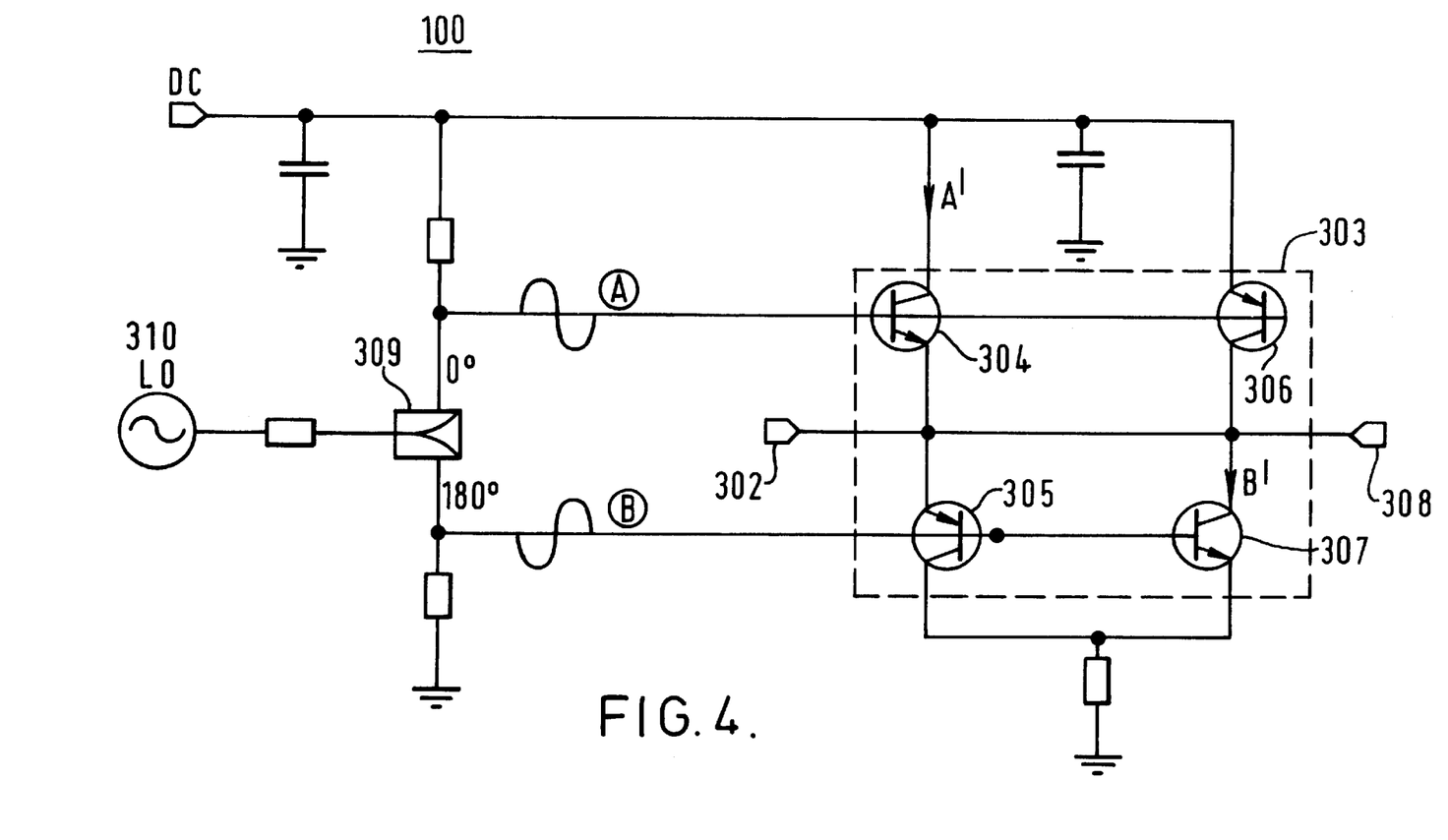
FIG. 4 schematically represents a second embodiment of a sub-harmonic mixer of the transceiver of the present invention FIG. 5 schematically shows the voltage waveforms of the local oscillator and IF ports of the second embodiment.

Turning to FIG. 4, there is shown a schematic circuit for a second embodiment of a sub-harmonic mixer of the present invention forming part of a transmitter phase lock loop of a radio telephone 100.

The output of the phase locked loop is connected at an input 302 of a transistor network 303 comprising four transistors 304, 305, 306, 307, and an intermediate frequency (IF) port 308 is connected at an output of the network 303.

The transistors 304, 305, 306, 307 are bipolar transistors arranged generally in a bridge configuration; transistors 304 and 307 are NPN transistors, transistors 305 and 306 are PNP transistors.

The phase lock loop input 302 and IF port 308 are coupled to the transistor network 303 between the emitter of transistor 304 and the collector of transistor 305, and between the emitter of transistor 306 and the collector of transistor 307. A constant DC voltage supply is connected to the respective collectors of transistors 304 and 306, and respective emitters of transistors 305 and 307 are connected to ground. The respective bases of the transistors are connected to a phase splitter circuit 309.

The 0 degrees phase shifted LO signal is connected to the bases of transistors 304 and 306, and the 180 degrees phase shifted LO signal is connected to the bases of the transistors 305 and 307.

The operation of the circuit will now be described.

Local oscillator generator 310 operating at half that required for mixing supplies an LO signal to the phase splitter 309. Phase splitter 309 generates two signals, one in-phase another in anti-phase local oscillator drive signals to transistors 304, 306, and 305 307 respectively. During the in-phase LO signal on its positive half cycle is applied to transistors 304 and 306, transistor 304 conducts and transistor 306 is switched off. During the in-phase LO signal on its negative half cycle is applied to transistors 304 and 306, transistor 304 is switched off and transistor 306 conducts. During the anti-phase LO signal is on its positive half cycle, transistor 307 conducts and transistor 305 is off. During the anti-phase LO signal is on its negative half cycle, transistor 307 is off and transistor 305 conducts. Since the in phase and anti-phase signals are 180 degrees phase shifted on the positive half-cycle of the local oscillator drive, transistors 304 and transistors 305 are on. On the negative half-cycle of the local oscillator drive, transistors 306 and transistors 307 are on. In either case, the phase lock loop and IF ports are connected to a virtual (AC) earth when a pair of transistors conduct. Since there are two pairs of transistors driven on opposite half-cycles, the summing point is driven close to ground on both half-cycles, hence the mixer switches in the same sense at twice the local oscillator frequency.

Figure 5:
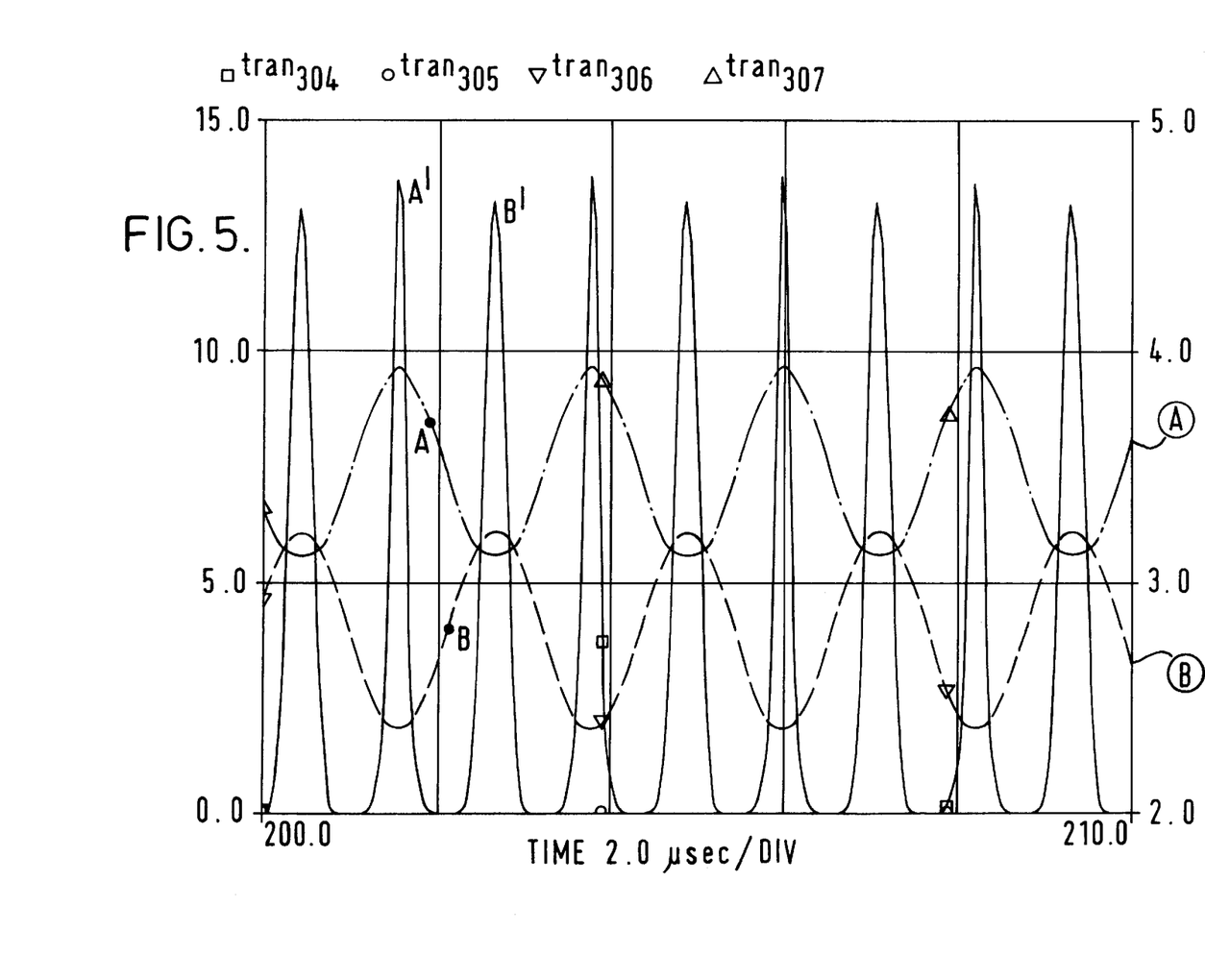

FIG. 5 illustrates the conductance of the transistor network in relation to the phase of the LO. It shows two opposite phase signals and the conductance of A the in-phase LO applied to transistors 304 and 306, and B the LO applied antiphase to transistors 305 and 307. A' is the current through the 304 and 305 transistor pair. B' is the current through 306 and 307 transistor pair. It shows that during every half cycle of the applied LO the subharmonic mixer switches. See FIG. 4 for correspondence of A A' and B B'.

In view of the foregoing description it will be evident to a person skilled in the art that various modifications may be made within the scope of the invention. For example, dual anti-parallel diode pairs may be utilised, further comprising diodes D3/D4 (126, 128) and shown dotted in FIG. 2. This further improves phase and amplitude balance, thereby further improving isolation from antenna 102.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What is claimed is:

1. A transceiver for a portable radio communication apparatus comprising a receiver for receiving a signal at a received frequency and including a local oscillator used in down conversion of the received frequency, a transmitter being operable to transmit at a transmission frequency, said transmission frequency being offset from, and aligned to, the received frequency by a predetermined frequency spacing, the transmitter including a mixer having a first port for inputting said transmission frequency signal and a second port for inputting the local oscillator signal, and comprising means for rectifying the input local oscillator signal to provide a conductance waveform at a multiple of the local oscillator signal and means for mixing said transmission frequency signal with the conductance waveform at said multiple of the local oscillator signal frequency for downconverting the transmission frequency signal to an intermediate transmitter frequency signal.

2. A transceiver according to claim 1, wherein the rectifying means and the coupling means comprise a phase splitter and switching means, wherein a signal output from the phase splitter drives the switching means at a multiple of the local oscillator frequency.

3. A transceiver according to claim 2, wherein the transformer is a discrete element.

4. A transceiver according to claim 2, wherein the phase splitter is a strip line, slot-line, co-planar microstrip and/or microstrip balanced to unbalanced transformer.

5. A transceiver according to claims 2, wherein the phase splitter comprises a balanced anti-phase output transformer.

6. A transceiver according to claim 5, wherein the switching means comprises an anti-parallel diode pair, and respective diodes are electrically coupled to respective arms of the balanced output of the transformer.

7. A transceiver according to claim 6, wherein the switching means comprises a further anti-parallel diode pair, and respective diodes of the further anti-parallel pair are reversibly electrically coupled to respective arms of the balanced output of the transformer relative to the said anti-parallel diode pair.

8. A transceiver according to claim 4, wherein the diodes are Schottky diodes.

9. A transceiver according to claim 4, wherein the diodes are fabricated from the same region of semi-conductor wafer during manufacture.

10. A transceiver according to claim 1, wherein the rectifying means and the coupling means comprise a phase splitter and a plurality of transistors arranged in a network, wherein a signal output from the driver transistor drives the transistor network at a multiple of the local oscillator frequency.

11. A transceiver according to claim 10, wherein the phase splitter provides anti-phase local oscillator drive signals to the plurality of transistors arranged in a network.

12. A transceiver according to claim 1, wherein said mixer forms part of phase locked loop for upconverting the frequency of a baseband signal to transmission frequency for radio transmission, the phase locked loop comprising:

an input for application of a signal having a reference frequency;

an output for outputting the signal for radio transmission;

a filter in its forward path for passing the baseband signal; the mixer and a frequency divider in its feedback path for downconvering the frequency of the output signal to provide a signal having a downconverted frequency of substantially the reference frequency; and a modulator coupled to the input or the feedback path for modulating the baseband signal onto the signal having the respective reference frequency or downconverted frequency.

* * * * *